US008440568B2

(12) United States Patent
Ugajin

(10) Patent No.: US 8,440,568 B2
(45) Date of Patent: May 14, 2013

(54) SUBSTRATE ETCHING METHOD AND SYSTEM

(75) Inventor: Hajime Ugajin, Nirasaki (JP)

(73) Assignee: Tokyo Electron Limited (JP)

( * ) Notice: Subject to any disclaimer, the term of this patent is extended or adjusted under 35 U.S.C. 154(b) by 601 days.

(21) Appl. No.: 12/727,402

(22) Filed: Mar. 19, 2010

(65) Prior Publication Data
US 2010/0240218 A1 Sep. 23, 2010

(30) Foreign Application Priority Data

Mar. 19, 2009 (JP) .................................. 2009-067868
Mar. 2, 2010 (JP) .................................. 2010-045893

(51) Int. Cl.
*H01L 21/302* (2006.01)
(52) U.S. Cl.
USPC ............ 438/714; 438/719; 438/723; 438/743
(58) Field of Classification Search .................. 438/714, 438/719, 723, 743
See application file for complete search history.

(56) References Cited

U.S. PATENT DOCUMENTS

| 6,124,211 A * | 9/2000 | Butterbaugh et al. ........ 438/708 |
| 8,187,486 B1 * | 5/2012 | Liu et al. .......................... 216/79 |
| 2008/0160210 A1 * | 7/2008 | Yang et al. ..................... 427/534 |
| 2009/0191703 A1 * | 7/2009 | Lu et al. ......................... 438/637 |
| 2010/0193781 A1 * | 8/2010 | Tripathy et al. ................. 257/43 |

FOREIGN PATENT DOCUMENTS

| JP | 02-119134 | 5/1990 |
| JP | 2501295 | 3/1996 |
| JP | 2003-023000 | 1/2003 |
| JP | 2003340799 | 12/2003 |
| JP | 2007-180418 | 7/2007 |

* cited by examiner

*Primary Examiner* — Binh X Tran
(74) *Attorney, Agent, or Firm* — Cantor Colburn LLP

(57) ABSTRACT

The etching method includes etching the silicon oxide film by supplying a halogen-containing gas and a basic gas to the substrate so that the silicon oxide film is chemically reacted with the halogen-containing gas and the basic gas to generate a condensation layer; etching silicon by supplying a silicon etching gas, which includes at least one selected from the group consisting of an $F_2$ gas, an $XeF_2$ gas, and a $ClF_3$ gas, to the substrate; and after the etching of the silicon oxide film and the etching of the silicon, heating and removing the condensation layer from the substrate.

8 Claims, 13 Drawing Sheets

REFERENCE EXAMPLE

SUBSTRATE ETCHING METHOD AND SYSTEM

CROSS-REFERENCE TO RELATED PATENT APPLICATIONS

This application claims the benefit of Japanese Patent Application No. 2009-067868, filed on Mar. 19, 2009 in the Japan Patent Office and Japanese Patent Application No. 2010-045893, filed on Mar. 2, 2010 in the Japan Patent Office, the disclosure of which is incorporated herein in its entirety by reference.

BACKGROUND OF THE INVENTION

1. Field of the Invention

The present invention relates to a method and apparatus for etching a substrate having a silicon surface on which a silicon oxide film is formed, and more particularly, to a method and system for etching a native oxide film formed on a silicon surface in a contact hole.

2. Description of the Related Art

A method of manufacturing a transistor, which is the most representative device embedded in an integrated circuit, includes a process of forming a contact hole in an interlayer insulating film over source and drain regions and over a gate electrode formed of polycrystalline silicon, through which an electrode is led out. The contact hole is filled with a conductive material, such as tungsten or polycrystalline silicon, in a subsequent process in order to electrically connect a silicon surface to a metal electrode.

However, it is known that if silicon is left in an atmosphere containing oxygen, a native oxide film is thinly formed on the silicon surface. Once the native oxide film is formed between the contact hole and the silicon surface, contact resistance is increased, thereby making it difficult to operate the transistor at high speed. Accordingly, it is necessary to remove the native oxide film before the contact hole is filled with the conductive material.

In order to remove the native oxide film, a method of etching a native oxide film using an etchant, e.g., radicals or ions, by converting a carbon fluorine (CF)-based gas into plasma has been disclosed in Cited reference 1 (Japanese Laid-open Patent Publication No. hei 2-119134). However, the method disclosed in Cited reference 1 has disadvantages in that an etching rate is so high that the amount of etching of the native oxide film thinly formed on the silicon surface cannot be controlled, and another silicon oxide film, for example, a chemical vapor deposition (CVD) silicon oxide film in which a contact hole is formed is fairly cut off, thereby the shape being changed. Furthermore, the method disclosed in Cited reference 1 has a disadvantage in that since silicon under the native oxide film may also be damaged, an additional etching process for removing layers damaged due to etching is required.

To overcome the disadvantages, a method of etching a thin silicon oxide film, such as a native oxide film, without converting an etching gas into plasma has been disclosed in Cited reference 2 (Japanese Laid-open Patent Publication No. 2007-180418) and Cited reference 3 (Japanese Patent No. 2501295). The method disclosed in Cited references 2 and 3 includes a process of forming a condensation layer by supplying a mixed gas including an HF gas and an $NH_3$ gas to a surface of a silicon oxide film so that the silicon oxide film is chemically reacted with the mixed gas to alter the silicon oxide film, and a process of heating and vaporizing the condensation layer. The method disclosed in Cited references 2 and 3 is called a chemical oxide removal (COR) method. In recent years, the COR method has often been used to etch a native oxide film because the COR method has a low etching rate and can control the amount of etching of a thin silicon oxide film.

However, the COR method has disadvantages in that although the native oxide film under the contact hole is etched, contact resistance is increased. The COR method may have contact resistance that is about $10^{1\sim5}$ times higher than that of a wet etching method such as a buffered hydrofluoric acid (BHF) method.

Upon examining the reason why the contact resistance is increased, the inventor of the present invention has found that the contact resistance is increased due to carbon implanted into the silicon and damage to a single crystal silicon substrate due to plasma. The carbon may be carbon contained in a photoresist layer or in a CF-based gas used to dry etch the interlayer insulating film.

Since the wet etching method, such as the BHF method, cuts off the silicon to some extent, a carbon layer and plasma damaged portion of the substrate are removed, thereby reducing contact resistance. On the other hand, the COR method using dry etching does not cut off the silicon at all. A layer containing carbon is not removed, thereby increasing contact resistance.

A method of removing a high resistance layer formed of SiC or $SiO_x$ inside silicon is disclosed in Cited reference 4 (Japanese Laid-open Patent Publication No. 2003-23000). The method disclosed in Cited reference 4 includes forming a contact hole by using plasma etching and continuously performing $H_2$ plasma treatment in the same chamber. Since the silicon is etched due to $H_2$ plasma, the high resistance layer inside the silicon under the contact hole may be removed. However, although carbon implanted into the silicon is removed, the damaged silicon due to the $H_2$ plasma will remain.

However, the method disclosed in Cited reference 4 additionally performs wet etching after the plasma etching, both an oxide film and a damaged layer are removed. However, since the COR method does not etch silicon at all, even though the COR method is performed after the plasma etching of Cited reference 4 is performed, the silicon damaged by the plasma may still remain. Accordingly, a process of wet etching silicon is required in addition to dry etching by the COR method.

SUMMARY OF THE INVENTION

To solve the above and/or other problems, the present invention provides a method and system for etching a substrate which may reduce contact resistance.

According to an aspect of the present invention, there is provided a method of etching a substrate having a silicon surface on which a silicon oxide film is formed, the method including etching the silicon oxide film by supplying a halogen-containing gas and a basic gas to the substrate so that the silicon oxide film is chemically reacted with the halogen-containing gas and the basic gas to generate a condensation layer; etching silicon by supplying a silicon etching gas, which includes at least one selected from the group consisting of a fluorine ($F_2$) gas, a xenon difluoride ($XeF_2$) gas, and a chlorine trifluoride ($ClF_3$) gas, to the substrate; and after the etching of the silicon oxide film and the etching of the silicon, heating and removing the condensation layer from the substrate.

According to another aspect of the present invention, there is provided a system for etching a substrate having a silicon surface on which a silicon oxide film is formed, the system including a processing container including a loading table on which the substrate is placed; a dry etching device including a gas supply line through which a halogen-containing gas, a basic gas, and a silicon etching gas including at least one selected from the group consisting of an $F_2$ gas, a $XeF_2$ gas, and a $ClF_3$ gas are supplied to the processing container, and an exhaust line through which a residual gas is discharged from the processing container; and a heat treatment device for heating the substrate, wherein the dry etching device etches the silicon oxide film by supplying the halogen-containing gas and the basic gas to the substrate so that the silicon oxide film is chemically reacted with the halogen-containing gas and the basic gas to generate a condensation layer, and etches the silicon by supplying the silicon etching gas to the substrate, wherein the heat treatment device heats and removes the condensation layer from the substrate.

According to another aspect of the present invention, there is provided a recording medium having embodied thereon a program for executing a method by using a control unit of a system for etching a substrate having a silicon surface on which a silicon oxide film is formed, wherein the method includes etching the silicon oxide film by supplying a halogen-containing gas and a basic gas to the substrate so that the silicon oxide film is chemically reacted with the halogen-containing gas and the basic gas to generate a condensation layer; etching silicon by supplying a silicon etching gas, which includes at least one selected from the group consisting of an $F_2$ gas, a $XeF_2$ gas, and a $ClF_3$ gas, to the substrate; and after the etching of the silicon oxide film and the etching of the silicon, heating and removing the condensation layer from the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
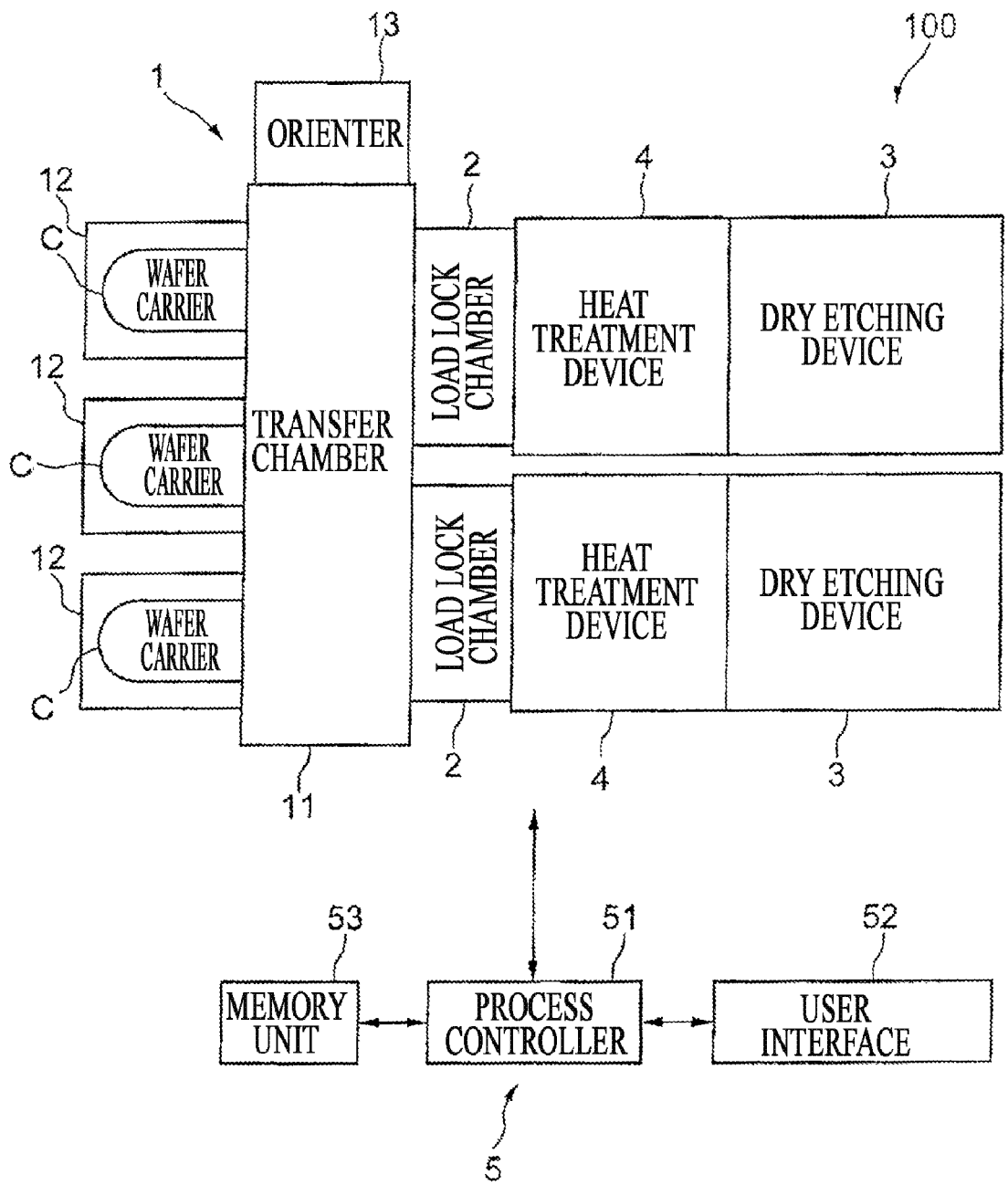
FIG. 1 is a plan view of a system for etching a substrate, according to an embodiment of the present invention.

The present invention will be described in detail by explaining exemplary embodiments of the invention with reference to the attached drawings. Like reference numerals in the drawings denote like elements.

<Etching System according to Embodiment of the Present Invention>

FIG. 1 is a plan view of a system 100 for etching a substrate, according to an embodiment of the present invention. The system 100 includes a delivering unit 1 for carrying a semiconductor wafer (referred to as a wafer hereinafter) into or out of the system 100, a load lock chamber 2 constituted adjacent to the delivering unit 1, a dry etching device 3 for performing dry etching on the wafer, a heat treatment device 4 for performing heat treatment on the wafer having been dry etched, and a control unit 5 for controlling each element of the system 100.

Two of the load lock chambers 2, two of the dry etching devices 3, and two of the heat treatment devices 4 are constituted in the etching system 100 of the embodiment illustrated in FIG. 1. The load lock chamber 2, the heat treatment device 4, and the dry etching device 3 are aligned sequentially from the delivering unit 1. Gate valves (not shown) are respectively constituted between the delivering unit 1 and the load lock chamber 2, between the load lock chamber 2 and the heat treatment device 4, and between the heat treatment device 4 and the dry etching device 3. Due to the gate valves, spaces between the delivering unit 1 and the load lock chamber 2, between the load lock chamber 2 and the heat treatment device 4, and between the heat treatment device 4 and the dry etching device 3 may be opened and closed.

The delivering unit 1 includes a transfer chamber 11 in which a transfer mechanism (not shown) for transferring the wafer is located. A loading table 12 is constituted on a side of the transfer chamber 11 in a longitudinal direction of the transfer chamber 11 opposite to the load lock chamber 2. A plurality of the loading tables 12, e.g., three loading tables in this embodiment, are included in the delivering unit 1 in FIG. 1. Wafer carriers C for receiving a plurality of the wafers are placed on the plurality of loading tables 12. An orienter 13 for determining the wafer position by, for example, optically obtaining the amount of eccentricity by rotating the wafer is constituted on a side of the transfer chamber 11 in a width direction of the transfer chamber 11. For example, the transfer mechanism located in the transfer chamber 11 may transfer the wafer one by one between the wafer carrier C, the orienter 13, and the load lock chambers 2.

The load lock chamber 2 is configured such that a pressure in the load lock chamber 2 is switchable between an atmospheric pressure state and a vacuum state, and a transfer mechanism (not shown) is located in the load lock chamber 2.

If the wafer is to be transferred from the transfer chamber 11 to the load lock chamber 2, the pressure in the load lock chamber 2 switches to the atmospheric pressure state to open the gate valve at the side of the transfer chamber 11. Next, the wafer is guided to the transfer mechanism located in the load lock chamber 2 by using the transfer mechanism located in the transfer chamber 11.

If the wafer is to be transferred from the load lock chamber 2 to the dry etching device 3, the gate valve at the side of the transfer chamber 11 is closed, and the pressure in the load lock chamber 2 switches to the vacuum state that is equal to a pressure in the heat treatment device 4 and the dry etching device 3. Next, the gate valve at the side of the heat treatment device 4 and the gate valve between the heat treatment device 4 and the dry etching device 3 are opened. Next, the wafer is transferred from the load lock chamber 2 to the dry etching device 3 through the heat treatment device 4 by using the transfer mechanism located in the load lock chamber 2.

If the wafer is to be transferred from the heat treatment device 4 to the load lock chamber 2, the gate valve at the side of the heat treatment device 4 is opened, and the wafer is transferred from the heat treatment device 4 to the load lock chamber 2 by using the transfer mechanism located in the load lock chamber 2.

If the wafer on which drying etching and heat treatment have been performed is to be transferred from the load lock chamber 2 to the transfer chamber 11, the gate valve at the side of the transfer chamber 11 and the gate valve at the side of the heat treatment device 4 are closed, and the pressure in the load lock chamber 2 switches to the atmospheric pressure state that is equal to a pressure in the transfer chamber 11. Next, the gate valve at the side of the transfer chamber 11 is opened, and the wafer is guided to the transfer mechanism located in the transfer chamber 11 by using the transfer mechanism located in the load lock chamber 2.

Figure 2:
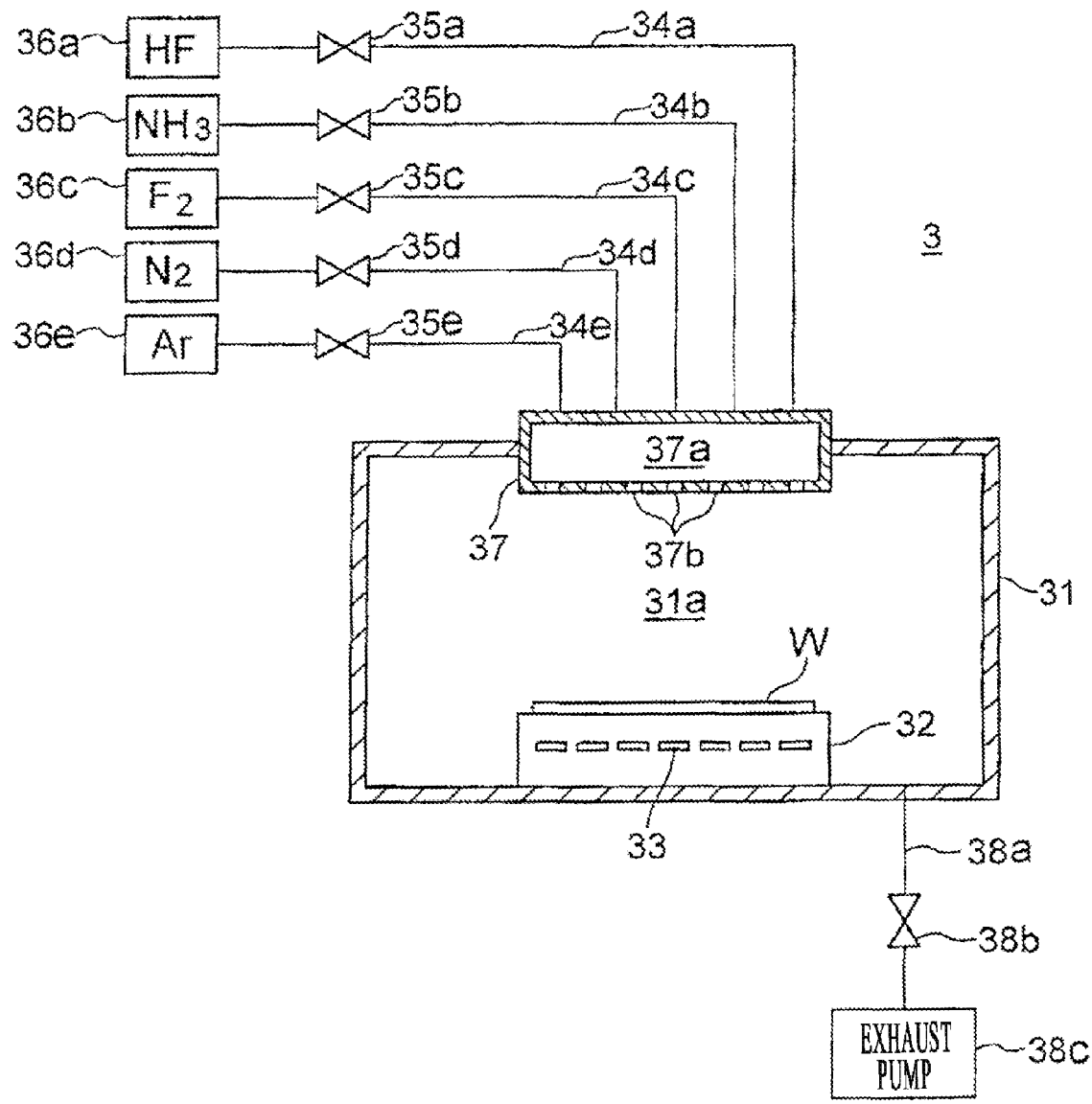
FIG. 2 is a cross-sectional view of a dry etching device of the system of FIG. 1, according to an embodiment of the present invention.

FIG. 2 is a cross-sectional view of the dry etching device 3 according to an embodiment of the present invention. Referring to FIG. 2, the dry etching device 3 includes a chamber 31 which is sealed and in which a wafer W is received. A loading table 32 on which the wafer W is horizontally placed is constituted in the chamber 31. A temperature control mechanism 33 for cooling or heating the wafer W to a predetermined temperature is constituted in the loading table 32. An inlet/outlet through which the wafer W is carried into or out of the heat treatment device 4 is constituted in a side wall of the chamber 31.

A hydrofluoric (HF) gas supply line 34a for supplying an HF gas as an etching gas into the chamber 31, an ammonia ($NH_3$) gas supply line 34b for supplying an $NH_3$ gas as an etching gas into the chamber 31, a fluorine ($F_2$) gas supply line 34c for supplying an $F_2$ gas as an etching gas into the chamber 31, a nitrogen ($N_2$) gas supply line 34d for supplying a $N_2$ gas as an inert gas into the chamber 31, and an argon (Ar) gas supply line 34e for supplying an Ar gas as an inert gas into the chamber 31 are connected to the dry etching device 3.

A first end of the HF gas supply line 34a is connected to an HF gas supply source 36a through a flow control valve 35a for adjusting the amount of the HF gas supplied into the chamber 31. Likewise, a first end of the $NH_3$ gas supply line 34b is connected to an $NH_3$ gas supply source 36b through a flow control valve 35b, a first end of the $F_2$ gas supply line 34c is connected to an $F_2$ gas supply source 36c through a flow control valve 35c, a first end of the $N_2$ gas supply line 34d is connected to a $N_2$ gas supply source 36d through a flow control valve 35d, and a first end of the Ar gas supply line 34e is connected to an Ar gas supply source 36e through a flow control valve 35e.

A shower head 37 is constituted on a top surface of the chamber 31. Each of second ends of the HF gas supply line 34a, the $NH_3$ gas supply line 34b, the $F_2$ gas supply line 34c, the $N_2$ gas supply line 34d, and the Ar gas supply line 34e is connected to the shower head 37. The HF gas, the $NH_3$ gas, the $F_2$ gas, the $N_2$ gas, and the Ar gas are supplied to a diffusion space 37a in the shower head 37, and are ejected into a processing space 31a in the chamber 31 through a plurality of gas ejection holes 37b formed in a surface of the shower head 37 facing the loading table 32.

An exhaust line 38a is connected to a bottom surface of the chamber 31. A pressure controller 38b, and an exhaust pump 38c for performing forced discharging are constituted on the exhaust line 38a. The chamber 31 may be depressurized to a predetermined pressure by adjusting the pressure controller 35b and operating the exhaust pump 38c.

Figure 3:
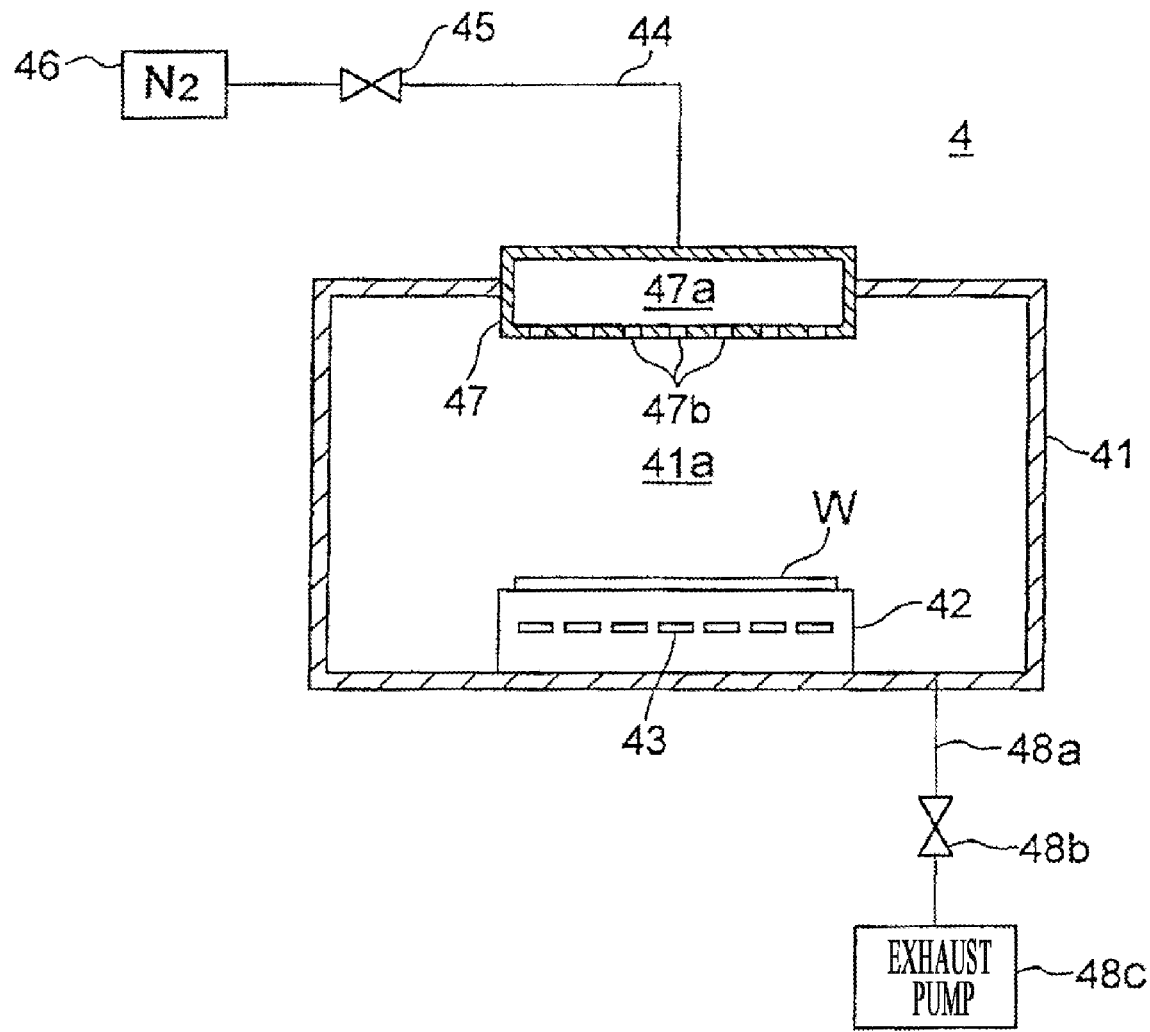
FIG. 3 is a cross-sectional view of a heat treatment device of the system of FIG. 1, according to an embodiment of the present invention.

FIG. 3 is a cross-sectional view of the heat treatment device 4, according to an embodiment of the present invention. Referring to FIG. 3, the heat treatment device 4 includes a chamber 41 which is sealed and in which a wafer W is received. A loading table 42 on which the wafer W is horizontally placed is constituted in the chamber 41. A heater 43 for heating the wafer W to a predetermined temperature is constituted in the loading table 42. An inlet/outlet (not shown) for carrying the wafer W into or out of the drying etching device 3 and an inlet/outlet (not shown) for carrying the wafer W into or out of the load lock chamber 2 are constituted in side walls of the chamber 41.

A $N_2$ gas supply line 44 for supplying an inert gas, for example, a $N_2$ gas, as an atmospheric gas into the chamber 41 is connected to the heat treatment device 4. A first end of the $N_2$ gas supply line 44 is connected to a $N_2$ gas supply source 46 through a flow control valve 45 for adjusting the amount of the $N_2$ gas supplied into the chamber 41.

A shower head 47 is constituted on a top surface of the chamber 41. A second end of the $N_2$ gas supply line 44 is connected to the shower head 47. The $N_2$ gas is supplied to a diffusion space 47a in the shower head 47, and is ejected into a processing space 41a in the chamber 41 through a plurality of gas ejection holes 47b formed in a surface of the chamber 41 facing the loading table 42.

An exhaust line 48a is connected to a bottom surface of the chamber 41. A pressure controller 48b, and an exhaust pump 48c for performing forced discharging are constituted on the exhaust line 48a. The chamber 41 may be depressurized to a predetermined pressure by adjusting the pressure controller 48b and operating the exhaust pump 48c.

The control unit 5 includes a process controller 51 including a micro processor (computer), a user interface 52 including a keyboard used to input commands so as for an operator to manage the system 100 or a display unit on which a state of the system 100 is displayed, and a memory unit 53 for storing a control program for performing a variety of processing functions executed in the system 100 under the control of the process controller 51, various data, and a program, that is, a recipe, for executing a method used by the system 100 according to conditions.

The recipe is stored in a memory medium in the memory unit 53. The memory medium may be a hard disk, or a movable medium such as a compact disk read-only memory (CD-ROM), a digital versatile disk (DVD), or a flash memory. For example, the recipe may be transmitted through a dedicated line from another device. If necessary, the system 100 may perform dry etching under the control of the process controller 51 by calling a recipe from the memory unit 53 according to instructions from the user interface 52 and executing the recipe in the processing controller 51.

<Dry Etching Method according to Embodiment of the Present Invention and Semiconductor Device Manufacturing Method Using the Dry Etching Method>

A method of dry etching a substrate according to an embodiment of the present invention will now be explained. FIGS. 4(a) through 4(g) illustrate a method of dry etching a substrate to manufacture a semiconductor device, according to an embodiment of the present invention. The following explanation will be made on a case where the method is applied to cleaning of a portion under a contact hole reaching a semiconductor wafer, e.g., a silicon substrate. However, the present embodiment is not limited thereto, and the method may be applied to forming of a contact hole reaching a conductor layer including silicon or polysilicon, and cleaning of a portion under the contact hole.

Figure 4:
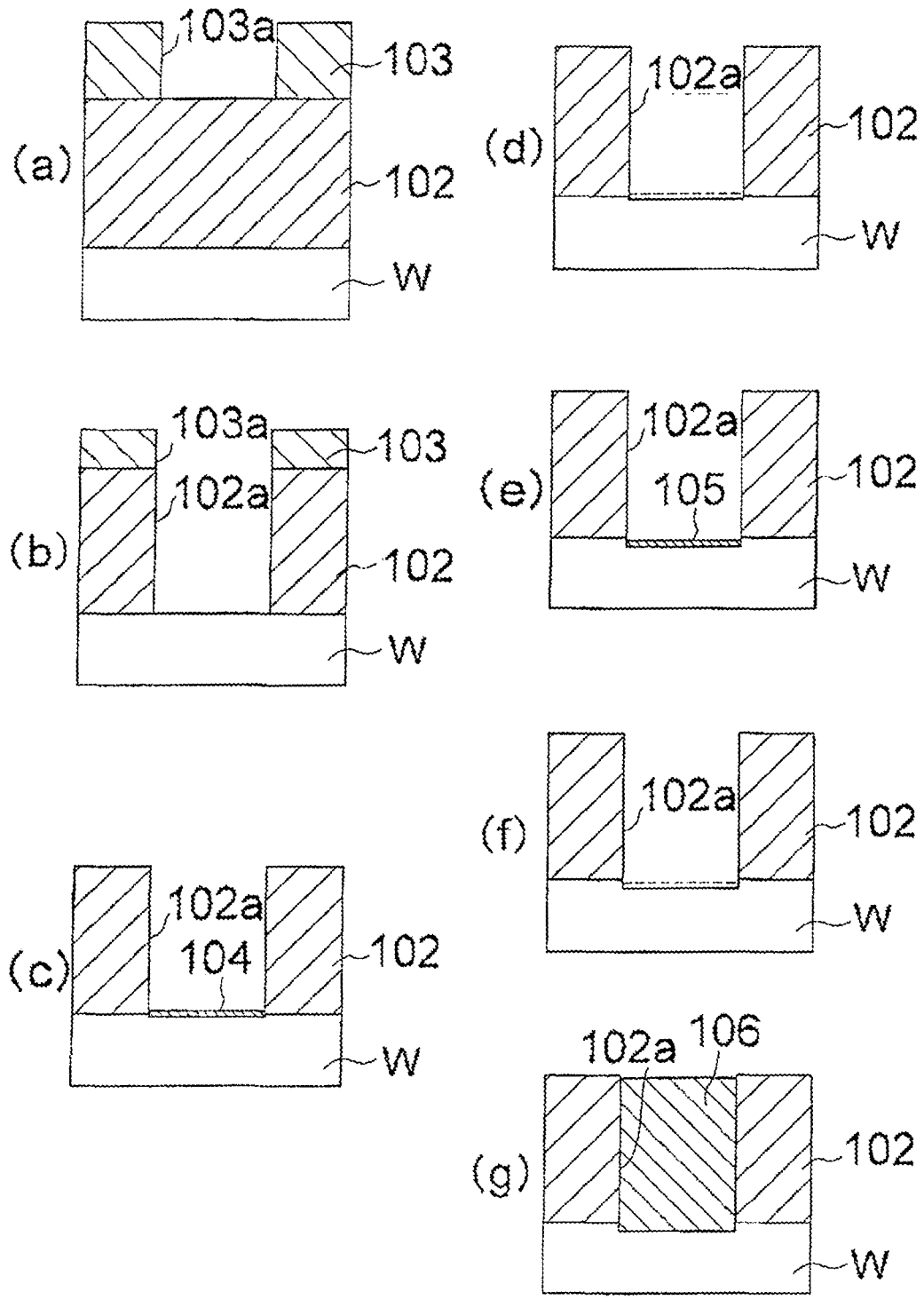
FIGS. 4(a) through 4(g) are cross-sectional views illustrating a method of dry etching a substrate, according to an embodiment of the present invention.

Referring to FIG. 4(a), a silicon oxide-based insulating film, for example, an interlayer insulating film 102 formed of borophosphosilicate glass (BPSG), is formed on a wafer (silicon substrate) W. Next, a photoresist is coated on the interlayer insulating film 102 to form a photoresist layer 103. Next, a window 103a corresponding to a pattern of a contact hole is formed in the photoresist layer 103 by using photolithography.

Referring to FIG. 4(b), the interlayer insulating film 102 is dry etched using, for example, a carbon fluorine (CF)-based etching gas, by using the photoresist layer 103 as a mask, to form a contact hole 102a in the interlayer insulating film 102.

Referring to FIG. 4(c), the photoresist layer 103 is removed by, for example, ashing. At this time, a native oxide ($SiO_2$) film 104 is formed on a surface of the wafer W exposed through the contact hole 102a.

Referring to FIG. 4(d), the wafer W on which the native oxide film 104 is formed is carried into the system 100 of FIG. 1 and a portion under the contact hole 102a, that is, the native oxide film 104, is cleaned (dry etched) by the dry etching device 3.

Figure 5:
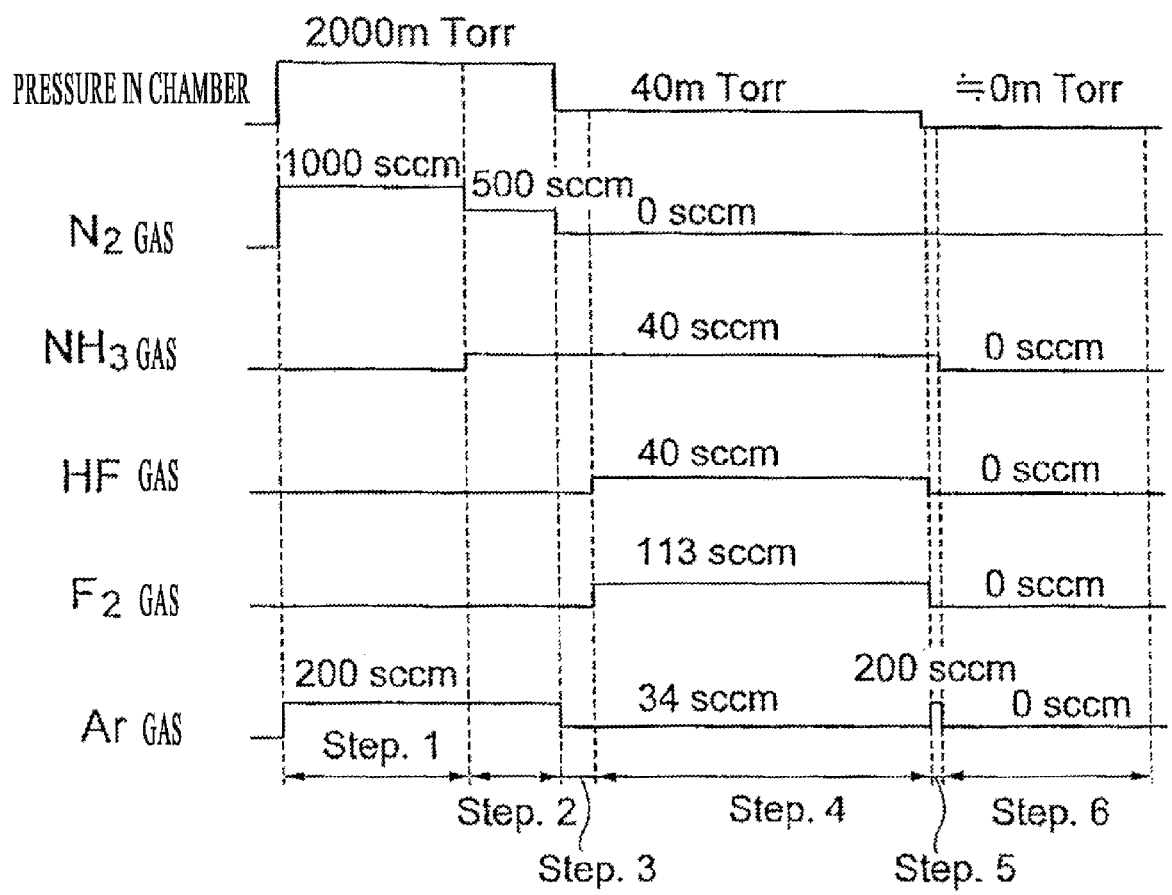
FIG. 5 is a timing chart illustrating a pressure in a chamber and a timing at which a gas is supplied during a cleaning process of the method of FIGS. 4(a) through 4(g)

In this embodiment, the cleaning of the portion under the contact hole 102a is performed as follows. FIG. 5 is a timing chart illustrating a pressure in the chamber 31 and a timing at which a gas is supplied during a cleaning process of the method of FIGS. 4(a) through 4(g).

The wafer W on which the native oxide film 104 is formed illustrated in FIG. 4(c) is carried into the chamber 31 of the dry etching device 3. Next, a $N_2$ gas and an Ar gas are supplied at a flow rate of, for example, 1000 sccm and at a flow rate of, for example, 200 sccm, respectively, into the chamber 31, a pressure in the chamber 31 may be 2000 mTorr, and a temperature of the wafer W may be 40° C. This state is maintained for, for example, 60 seconds (Step 1). The $N_2$ gas or the Ar gas are used to dilute an HF gas and an $NH_3$ gas which are to be subsequently supplied. If the $N_2$ gas or the Ar gas are small, the HF gas and the $NH_3$ gas may reach with each other in the shower head 37 to form ammonium fluoride ($NH_4F$), thereby blocking gas supply.

Next, the flow rate of the $N_2$ gas is reduced from 1000 sccm to 500 sccm, and, an $NH_3$ gas is supplied at a flow rate of, for example, 40 sccm. This state is maintained for, for example, 30 seconds (Step 2). The reason why the $NH_3$ gas is supplied to the wafer W before an HF gas is supplied is that the $NH_3$ gas is to be first adsorbed onto the wafer W. Accordingly, a layer formed of, for example, BPSG, which may react with the HF gas may be protected.

Next, the supply of the $N_2$ gas is stopped, the flow rate of the Ar gas is reduced from 200 sccm to 34 sccm, and the pressure in the chamber 31 is reduced to, for example, 40 mTorr. This state is maintained for, for example, 10 seconds (Step 3). Step 3 is a pre-step for adjusting a pressure in Step 4.

Next, an HF gas and an $F_2$ gas are supplied at a flow rate of, for example, 40 sccm and at a flow rate of, for example, 113 sccm, respectively. This state is maintained for, for example, 110 seconds (Step 4). When the HF gas and the $NH_3$ gas are supplied to the wafer W, the native oxide film 104 formed of $SiO_2$ is chemically reacted with the HF gas and the $NH_3$ gas, to form a condensation layer 105 formed of ammonium silicon fluoride (($NH_4$)$_2$$SiF_6$) on the wafer W. Silicon under the condensation layer 105 is etched due to the $F_2$ gas.

Next, the supply of the HF gas and the $F_2$ gas is stopped and the flow rate of the Ar gas is increased from 34 sccm to 200 sccm. Also, the pressure in the chamber 31 is reduced to about 0 mTorr. This state is maintained for, for example, 5 seconds (Step 5)

Next, the supply of the $NH_3$ gas and the Ar gas is stopped. This state is maintained for, for example, 60 seconds (Step 6).

Due to the cleaning process, referring to FIG. 4(e), the native oxide film 104 is removed from the bottom of the contact hole 102a and the condensation layer 105 formed of ($NH_4$)$_2$$SiF_6$ which is obtained by chemically reacting between the silicon oxide film and the HF gas and the $NH_3$ gas is formed under the contact hole 102a.

Next, the wafer W on which the condensation layer 105 is accumulated illustrated in FIG. 4(e) is carried into the chamber 41 of the heat treatment device 4. Next, a $N_2$ gas is supplied into the chamber 41 to heat the wafer W to, for example, 100 to 200° C. and change a pressure in the chamber 41 about 500 to 1000 mTorr. Accordingly, referring to FIG. 4(f), the condensation layer 105 is vaporized and removed from the contact hole 102a and a surface of the wafer W is exposed.

Referring to FIG. 4(g), the contact hole 102a is filled with a conductive material 106, for example, conductive polysilicon.

A semiconductor device having improved contact characteristics may be manufactured by the method of FIGS. 4(a) through 4(g) since there is no native oxide film under the contact hole 102a and contact resistance between the wafer (silicon substrate) W and the conductive material 106 is small.

<Advantages of the Dry Etching Method of FIGS. 4(a) through 4(g)>

Advantages of the dry etching method of FIGS. 4(a) through 4(g) will be explained in comparison with a reference example in terms of a process of removing the native oxide film 104.

Figure 6:
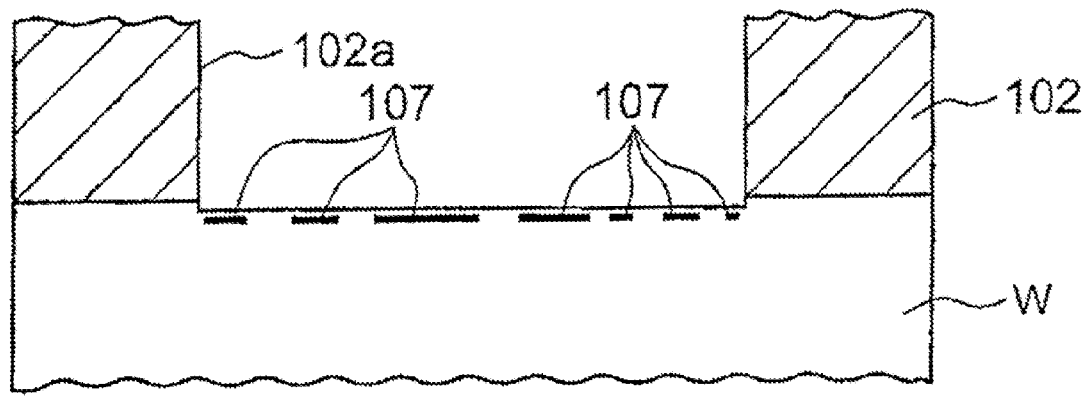
FIG. 6 is an enlarged cross-sectional view of a wafer after a native oxide film is removed in a reference example.

The reference example uses only an HF gas and an $NH_3$ gas as an etching gas to remove the native oxide film 104. FIG. 6 is an enlarged cross-sectional view of the wafer W after the native oxide film 104 is removed in the reference example.

Referring to FIG. 6, the reference example using only the HF gas and the $NH_3$ gas as the etching gas has an altered layer 107 formed between the wafer W and the conductive material 106. It is found from energy dispersive X-ray (EDX) analysis that the altered layer 107 contains carbon (C). Considering that the carbon is contained in the altered layer 107, it is assumed that the altered layer 107 is generated when carbon included in the photoresist layer 103 or carbon included in the CF-based etching gas used to form the contact hole 102a is introduced into the wafer W from the surface of the wafer W exposed through the contact hole 102a. Since the altered layer 107 remains, although the native oxide film 104 is removed, it is difficult to prevent contact resistance from increasing.

However, the method of FIGS. 4(a) through 4(g) adds an $F_2$ gas to an HF gas and an $NH_3$ gas to remove the native oxide film 104.

Figure 7:
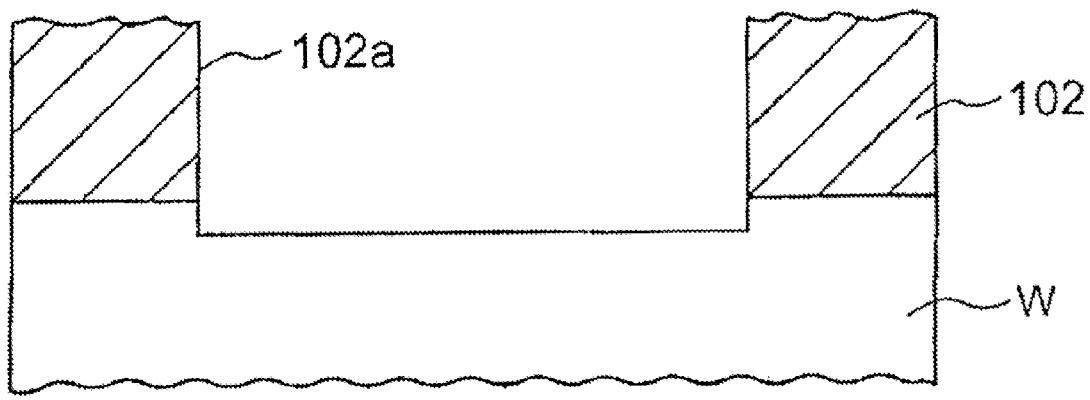
FIG. 7 is an enlarged cross-sectional view of the wafer after the native oxide film is removed in the method of FIGS. 4(a) through 4(g)

FIG. 7 is an enlarged cross-sectional view of the wafer W after the native oxide film 104 is removed in the method of FIGS. 4(a) through 4(g). Referring to FIG. 7, the method of FIGS. 4(a) through 4(g) using an HF gas, an $NH_3$ gas, and an $F_2$ gas as an etching gas removes the altered layer 107 formed between the wafer W and the conductive material 106.

It is assumed that the altered layer 107 is removed because, by adding the $F_2$ gas, not only the native oxide film 104 but also the surface layer of the wafer W, that is Si, and C injected in the surface layer of the wafer W is more etched compared to the reference example. That is, the wafer W and the altered layer 107 are etched as follows.

(Etching of Si (Wafer) and C (Altered Layer))

$$Si+C+4F_2 \rightarrow SiF_4+CF_4$$

Since silicon (Si) in the wafer W and carbon (C) in the altered layer 107 are gasified due to the above reaction, silicon under the condensation layer 105 and carbon introduced into the silicon may be removed. Although the condensation layer 105 is formed over the silicon, if the pressure in the chamber 31 is increased, the $F_2$ gas passes through the condensation layer 105, thereby making it possible to etch the silicon under the condensation layer 105.

If $SiO_2$ film is formed over silicon, since a silicon etching gas, i.e., an $F_2$ gas, does not pass through the $SiO_2$ film, the silicon under the $SiO_2$ film cannot be etched. However, the inventor of the present invention has found that it is possible that the silicon etching gas passes through the condensation layer 105 and helps to etch the silicon under the condensation layer 105. Since a COR process and a silicon etching process are performed simultaneously in the chamber 31, an additional device for performing a silicon etching process is not required, thereby improving total throughput and reducing manufacturing costs.

Figure 8:
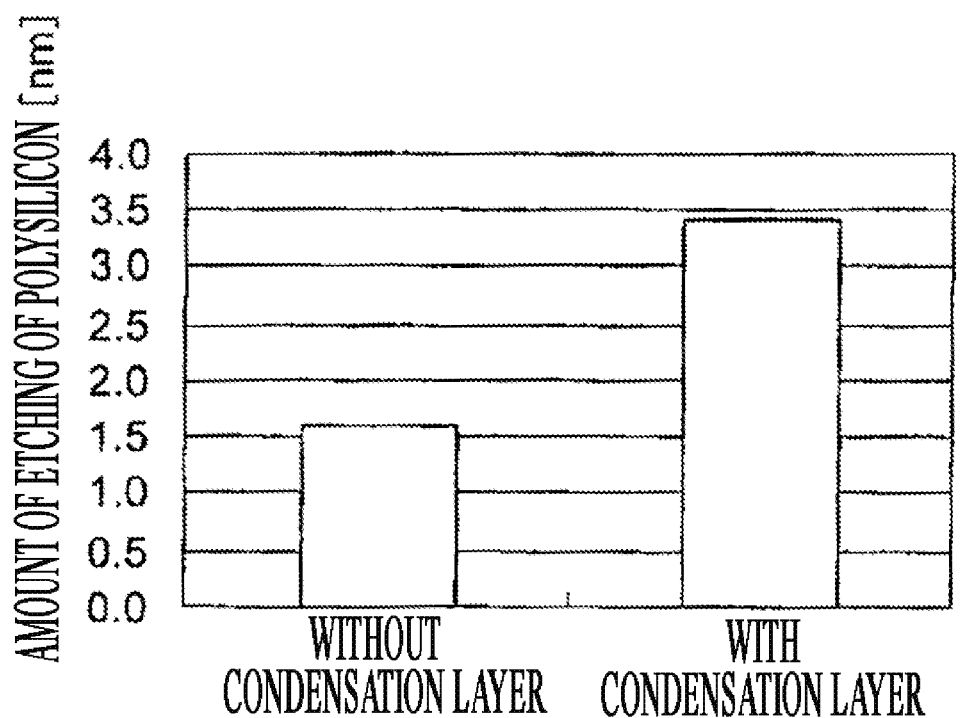
FIG. 8 is a graph illustrating the amounts of etching of polysilicon with and without a condensation layer.

Furthermore, since the condensation layer 105 exists, the amount of etching of silicon is increased compared to a case where there is no condensation layer. FIG. 8 is a graph illustrating the amounts of etching of polysilicon with and without a condensation layer under the same conditions, e.g., using an $F_2$ gas and an $NH_3$ gas. Referring to FIG. 8, the amount of etching of polysilicon when a condensation layer is formed over the polysilicon is more than two times greater than the amount of etching of polysilicon when no condensation layer is formed over the polysilicon. It is assumed that this is because $NH_3$ included in the condensation layer accelerates reaction between the silicon and $F_2$. Although the condensation layer 105 is formed over the silicon, the silicon is not only etched but also etching is accelerated, thereby greatly improving throughput.

The native oxide film 104 is etched through the following reactions (1), (2), and (3), as in a common COR process.

(Etching of Native Oxide film Formed of $SiO_2$)

$$SiO_2+4HF \rightarrow SiF_4+2H_2O \qquad (1)$$

(Generation of Condensation Layer)

$$SiF_4+2NH_3+2HF \rightarrow (NH_4)_2SiF_6 \qquad (2)$$

(Vaporization of Condensation Layer)

$$(NH_4)_2SiF_6 \rightarrow SiF_4+2NH_3+2HF \qquad (3)$$

Since the reaction (1) requires high activation energy, the reaction (1) does not occur simply by causing $SiO_2$ to contact an HF gas. In order to facilitate the reaction (1), it is necessary to mix an $F_2$ gas with an $NH_3$ gas and generate the condensation layer 105 by the reaction (2). Since the condensation layer 105 is generated due to the reaction (2), the reaction (1) is carried out to etch $SiO_2$. Since a drop in a temperature of the wafer W shifts the reaction (2) rightward, the amount of etching is increased. However, if the temperature of the wafer W is increased, the amount of etching may also be increased as will be explained later. The temperature of the wafer W is adjusted in order to control the amount of etching of $SiO_2$.

Figure 9:
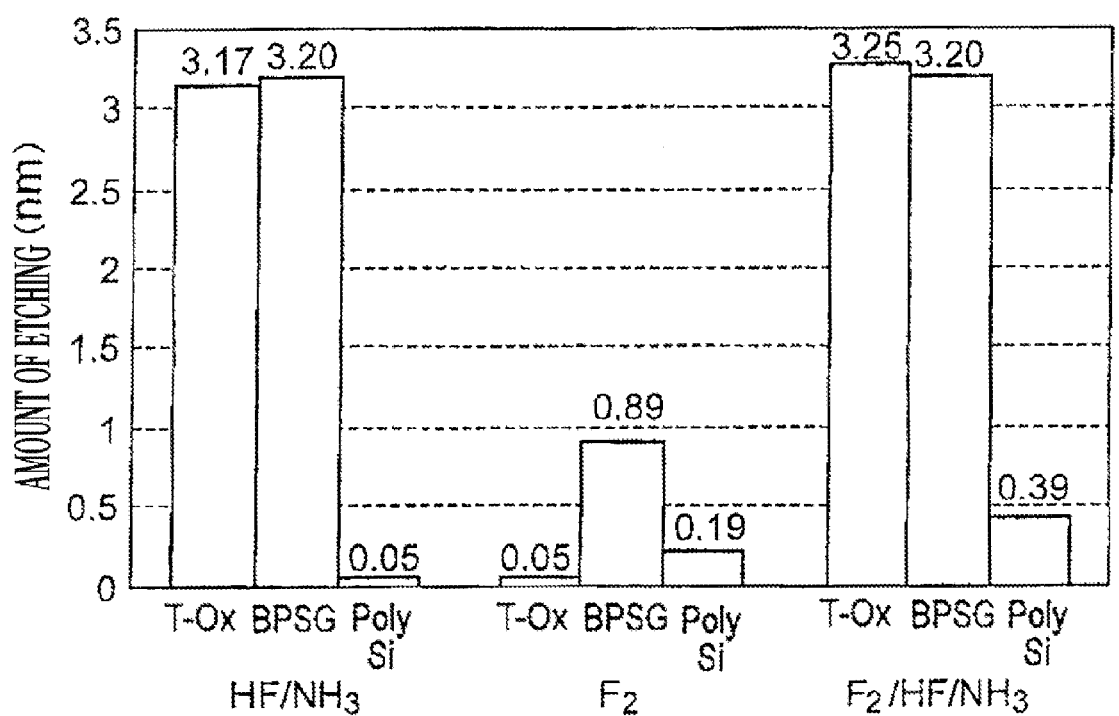
FIG. 9 is a graph illustrating the amounts of etching of a thermal oxide film, a silicon oxide-based insulating film, and polysilicon.

FIG. 9 is a graph illustrating the amounts of etching of a thermal oxide film T-Ox, a silicon oxide-based insulating film BPSG, and polysilicon Poly-Si when $HF/NH_3$, $F_2$, and $F_2/HF/NH_3$ are used as an etching gas. The graph of FIG. 9 was obtained from an experiment where a wafer W on which the thermal oxide film T-Ox is formed, a wafer W on which the silicon oxide-based insulating film BPSG, and a wafer W on which the polysilicon Poly-Si is formed were used. The thermal oxide film T-Ox may be considered as the native oxide film 104, the silicon oxide-based insulating film BPSG may be considered as the interlayer insulating film 102, and the polysilicon Poly-Si may be considered as the wafer (silicon substrate) W.

Referring to FIG. 9, when an HF gas and an $NH_3$ gas are used as an etching gas (i.e., reference example), the amounts of etching of the thermal oxide film T-Ox and the silicon oxide-based insulating film BPSG are high but the amount of etching of the polysilicon Poly-Si is very low, which means almost no cut-off has been occurred on the polysilicon Poly-Si.

When only an $F_2$ gas is used as an etching gas, the amount of etching of the polysilicon Poly-Si is greater than that of the case using the HF gas and the $NH_3$ gas as an etching gas (i.e., reference example), but the amounts of etching of the thermal oxide film T-Ox and the silicon oxide-based insulating film BPSG are less than those of the case using the HF gas and the $NH_3$ gas as an etching gas (i.e., reference example). In particular, the amount of etching of the silicon oxide-based insulating film BPSG is about 18 times greater than the amount of etching of the thermal oxide film T-Ox. If the case using only the $F_2$ gas as an etching gas is applied to cleaning of a portion under the contact hole 102a, the interlayer insulating film may be etched and the diameter of the contact hole 102a may be increased.

When an $F_2$ gas, an HF gas, and an $NH_3$ gas are simultaneously supplied as an etching gas, the amount of etching of the polysilicon Poly-Si is higher than that of the case using the HF gas and the $NH_3$ gas (i.e., reference example) and that of the case using only the $F_2$ gas. The reason why the amount of etching of the polysilicon when the $F_2$ gas, the HF gas, and the $NH_3$ gas are used is higher than that when only the $F_2$ gas is used is that the polysilicon Poly-Si is etched in a state where the native oxide film 104 is formed on the polysilicon Poly-Si. The polysilicon Poly-Si tends to be naturally oxidized. Etching of the polysilicon Poly-Si by the $F_2$ gas is impeded by the native oxide film 104.

Also, when the $F_2$ gas, the HF gas, and the $NH_3$ gas are simultaneously supplied as an etching gas, the amount of etching of the thermal oxide film T-Ox is high. Also, there is advantage that the amount of etching of the silicon oxide-based insulating film BPSG is smaller than that of the thermal oxide film T-Ox, unlike the case using the HF gas and the $NH_3$ gas (i.e., reference example) and the case using only the $F_2$ gas. When wet etching, such as BHF, is used, the amount of etching of the silicon oxide-based insulating film BPSG is increased to be about 10 times greater than that of the thermal oxide film T-Ox. Accordingly, almost without etching the interlayer insulating film 102, the native oxide film 104 thinly formed under the contact hole 102a can be removed.

Accordingly, the method of FIGS. 4(a) through 4(g) is suitable for cleaning a portion under the contact hole 102a. In addition, the method of FIGS. 4(a) through 4(g) can perform continuous processing without purging an etching gas and replacing the etching gas with another etching gas. Since plasma is not used, damage to peripheral elements including the interlayer insulating film 102 is reduced and the native oxide film 104 is removed. Accordingly, the method of FIGS. 4(a) through 4(g) does not require processing gas exchange, and reduces damage to peripheral elements including the interlayer insulating film 102.

<Dry Etching Method according to Another Embodiment of the Present Invention>

Figure 10:
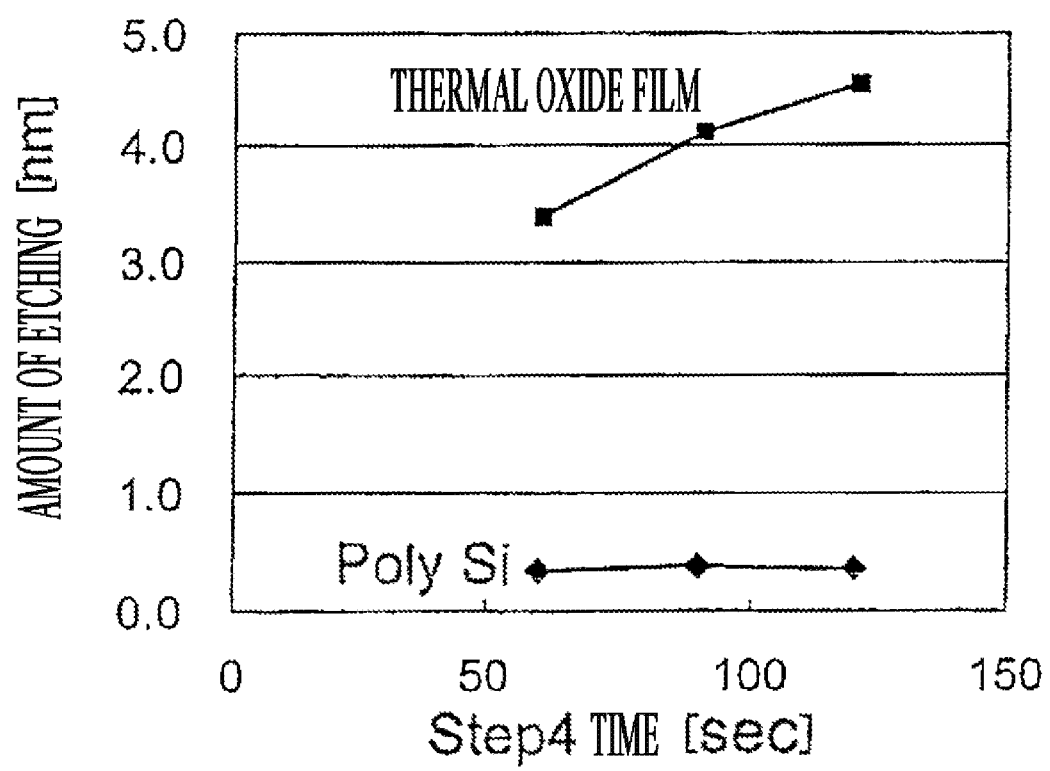
FIG. 10 is a graph illustrating a relationship between an etching time and the amounts of etching of a thermal oxide film T-Ox and polysilicon Poly-Si.

It could be found that the method of FIGS. 4(a) through 4(g) which simultaneously supplies an $F_2$ gas, an HF gas, and an $NH_3$ gas as an etching gas may etch polysilicon Poly-Si but cannot control the amount of etching of the polysilicon Poly-Si. FIG. 10 is a graph illustrating a relationship between an etching time (time of Step 4 in FIG. 5) and the amounts of etching of a thermal oxide film T-Ox and polysilicon Poly-Si. Referring to FIG. 10, as the etching time increases, the amount of etching of the thermal oxide film T-Ox increases. However, although the etching time increases, the amount of etching of the polysilicon Poly-Si is almost maintained at about 0.39 nm. Among the altered layer 107 into which carbon is implanted, a thick one may have a thickness of about 10 nm. If the amount of etching is about 0.39 nm, the altered layer 107 which is thick cannot be removed. In order to control the amount of etching of the polysilicon Poly-Si, a method of dry etching a substrate according to another embodiment of the present invention has been suggested.

The method of dry etching the substrate according to another embodiment of the present invention involves etching the native oxide film 104 by supplying an HF gas and an $NH_3$ gas and then etching silicon by supplying an $F_2$ gas, not simultaneously supplying an $F_2$ gas, an HF gas, and an $NH_3$ gas.

Figure 11:
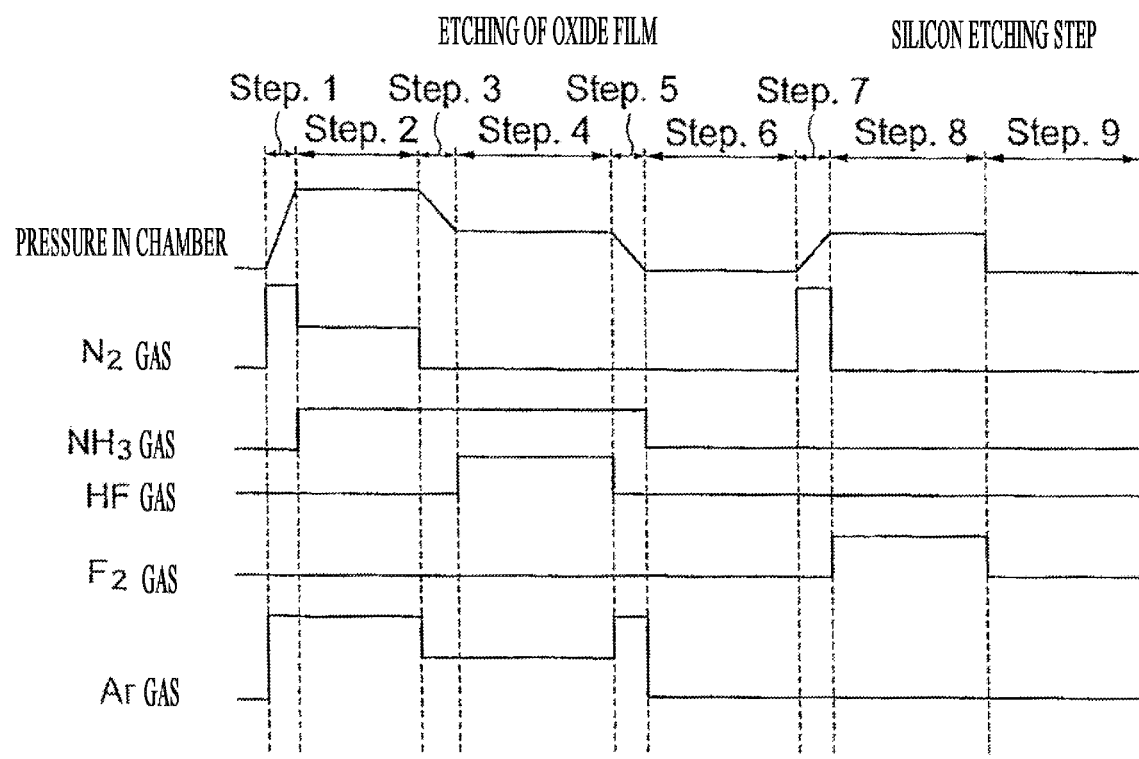
FIG. 11 is a timing chart illustrating a pressure in a chamber and a timing at which a gas is supplied in a method of dry etching a substrate according to another embodiment of the present invention.

FIG. 11 is an example of a timing chart illustrating a pressure in the chamber 31 and a timing at which a gas is supplied in the method of dry etching the substrate according to another embodiment of the present invention. After the wafer W on which the native oxide film 104 is formed is carried into the chamber 31 of the dry etching device 3, a $N_2$ gas and an Ar gas are supplied at a flow rate of, for example, 2000 sccm and at a flow rate of, for example, 200 sccm, respectively, into the chamber 31 to set a pressure in the chamber 31 to, for example, 2000 mTorr, and a temperature of the wafer W to, for example, 40° C. This state is maintained for, for example, 10 seconds (Step 1). The $N_2$ gas and the Ar gas are used to dilute an HF gas and an $NH_3$ gas which are to be subsequently supplied.

Next, the flow rate of the $N_2$ gas is reduced from 2000 sccm to 1500 sccm and an $NH_3$ gas is supplied at a flow rate of, for example, 80 sccm. This state is maintained for, for example, 30 seconds (Step 2). The reason why the $NH_3$ gas is supplied to the wafer W before an HF gas is supplied is that the $NH_3$ gas is to be first adsorbed onto the wafer W.

Next, the supply of the $N_2$ gas is stopped, the flow rate of the Ar gas is reduced from 200 sccm to 80 sccm, and the pressure in the chamber 31 is reduced to, for example, 20 mTorr. This state is maintained for, for example, 10 seconds (Step 3). Step 3 is a pre-step for adjusting a pressure in Step 4.

Next, an HF gas is supplied at a flow rate of 80 sccm. This state is maintained for, for example, 60 seconds (Step 4). In Step 4, the native oxide film 104 is etched.

$$SiO_2+4HF \rightarrow SiF_4+2H_2O \qquad (1)$$

$$SiF_4+2NH_3+2HF \rightarrow (NH_4)_2SiF_6 \qquad (2)$$

Due to the reactions (1) and (2), the native oxide film 104 formed of $SiO_2$ is chemically reacted with the HF gas and the $NH_3$ gas to form on the wafer W the condensation layer 105 formed of $(NH_4)_2SiF_6$ which is in a solid state.

Next, the supply of the HF gas is stopped, the flow rate of the Ar gas is increased from 80 sccm to 200 sccm, and the pressure in the chamber 31 is reduced to, for example, about 0 mTorr (Step 5). Step 5 is a pre-step for reducing a pressure to a pressure of Step 6.

Next, the supply of the $NH_3$ gas and the Ar gas is stopped, and the pressure in the chamber 31 is reduced to about 0 mTorr. This state is maintained for, for example, 20 seconds (Step 6). Since a vacuum pump is operated, once the supply of the $NH_3$ gas and the Ar gas is stopped, the HF gas and the $NH_3$ gas are discharged from the chamber 31. The reason why the HF gas and the $NH_3$ gas are discharged from the chamber 31 is that a product $NH_4F$ accumulated on the condensation layer 105 needs to be vaporized and removed, and a reaction between residual gases and a gas in a next step needs to be prevented.

Since the $NH_3$ gas and the HF gas are simultaneously supplied to etch the native oxide film 104 in Step 4, the following reaction occurs.

$$SiF_4+2NH_3+2HF \rightarrow (NH_4)_2SiF_6 \qquad (2)$$

Due to the reaction (2), the condensation layer 105 formed of $(NH_4)_2SiF_6$ is generated and the following reaction occurs.

$$NH_3+HF \rightarrow NH_4F \qquad (4)$$

Due to the reaction (4), the product $NH_4F$ is generated.

It is assumed that once the product $NH_4F$ is accumulated on the condensation layer 105, etching of silicon using the $F_2$ gas is impeded because the $F_2$ gas is difficult to pass through $NH_4F$. As long as the $NH_3$ gas and the HF gas are supplied, the product $NH_4F$ is generated and accumulated on the condensation layer 105. Due to a purge process of Step 6, however, the product $NH_4F$ accumulated on the condensation layer 105 can be easily vaporized. The condensation layer 105 may not be vaporized unless the condensation layer 105 is heated to a high temperature, and the condensation layer 105 remains on the wafer W even during the purge process of Step 6.

Next, a $N_2$ gas is supplied at a flow rate of 1000 sccm, and the pressure in the chamber 31 is increased to, for example, 1000 mTorr (Step 7). In Step 7, the pressure in the chamber 31 is increased to an etching pressure of Step 8 and then an $F_2$ gas is supplied.

Next, the supply of the $N_2$ gas is stopped, and the $F_2$ gas is supplied at the same flow rate of 1000 sccm as that of the $N_2$ gas in Step 7 to maintain the pressure in the chamber 31 at, for example, 1000 mTorr (Step 8). This state is maintained for, for example, 60 seconds. Since the $F_2$ gas is supplied, the following reaction occurs.

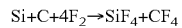

$$Si+C+4F_2 \rightarrow SiF_4+CF_4$$

Since silicon and carbon are gasified due to the above reaction, the silicon under the condensation layer 105 can be etched. Since the native oxide film 104 is already removed in an oxide film etching process of Step 7, the pressure in the chamber 31 is high enough, and the $F_2$ gas passes through the condensation layer 105, it is possible to etch the silicon under the condensation layer 105.

If $SiO_2$ film is formed over silicon, since a silicon etching gas, i.e., an $F_2$ gas, does not pass through the $SiO_2$ film, the silicon under the $SiO_2$ film cannot be etched. However, as described above, the inventor of the present invention has found that it is possible that the silicon etching gas (i.e., an $F_2$ gas) passes through the condensation layer 105 and helps to etch the silicon under the condensation layer 105. Since a COR process and a silicon etching process are performed sequentially in the chamber 31, an additional device for performing a silicon etching process is not required, thereby improving total throughput and reducing manufacturing costs. Furthermore, as described above, since the condensation layer 105 is used, the amount of etching of silicon is increased compared to a case where there is no condensation layer. Although the condensation layer 105 is formed over the silicon, the silicon is not only etched but also etching is accelerated, thereby greatly improving throughput.

Due to the cleaning process, the native oxide film 104 is removed from the bottom of the contact hole 102a and the condensation layer 105 formed of $(NH_4)_2SiF_6$ which is obtained by chemically reacting between the native oxide film 104 and the HF gas and the $NH_3$ gas is formed under the contact hole 102a (see FIG. 4(e)).

The wafer W on which the condensation layer 105 is accumulated is carried into the chamber 41 of the heat treatment device 4, the condensation layer 105 is vaporized, and the condensation layer 105 is removed from the bottom of the contact hole 102a in the same manner as that of the method of FIGS. 4(a) through 4(g).

Figure 12:
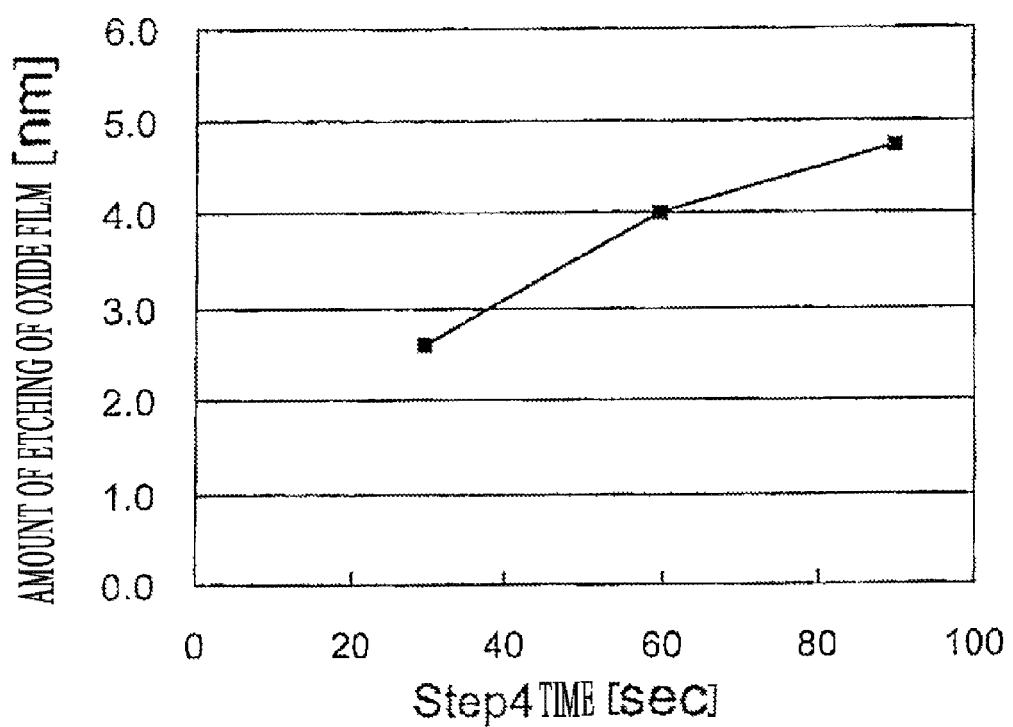
FIG. 12 is a graph illustrating a relationship between an etching time and the amount of etching of a silicon oxide film (thermal oxide film)
Figure 13:
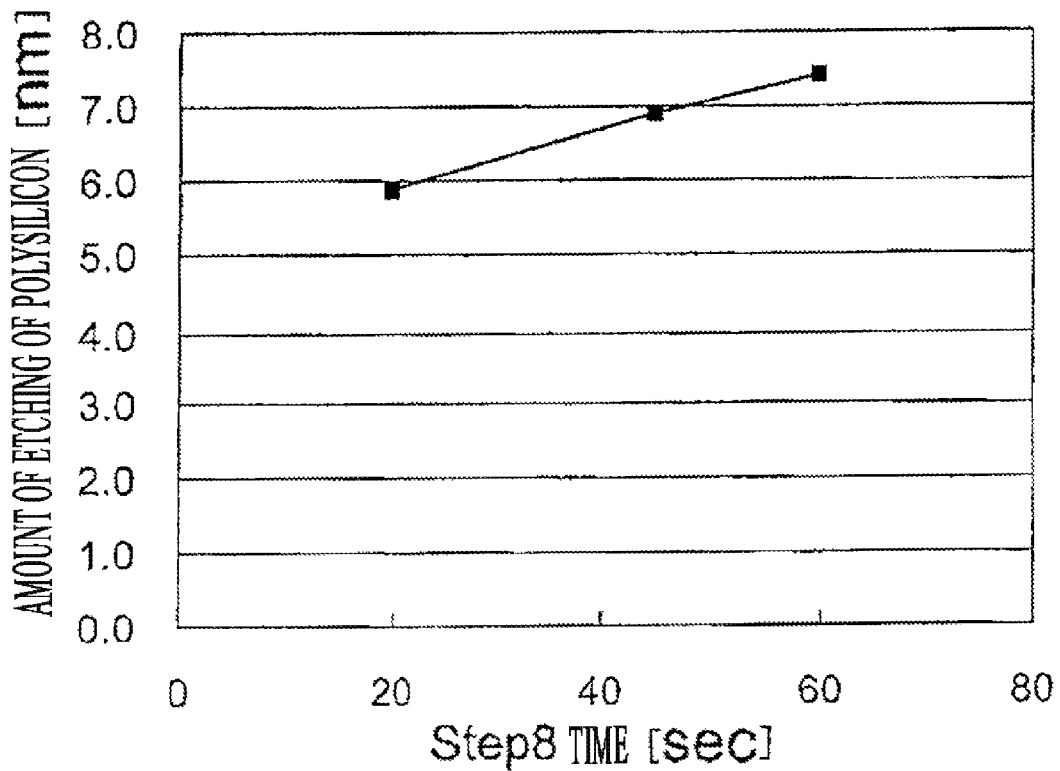
FIG. 13 is a graph illustrating a relationship between an etching time and the amount of etching of silicon (polysilicon).

FIG. 12 is a graph illustrating a relationship between an etching time and the amount of etching of a silicon oxide film (thermal oxide film) in Step 4. FIG. 13 is a graph illustrating a relationship between an etching time and the amount of etching of silicon (polysilicon) in Step 8. Referring to FIGS. 12 and 13, since an etching process of Step 4 and an etching process of Step 8 are distinguished from each other, the amount of etching of the silicon oxide film (thermal oxide film) and the amount of etching of the silicon (polysilicon) can be separately controlled.

Table 1 shows an etching selectivity (in a case where Si ratio is set to 1) of each layer when only an $F_2$ gas is used, an $F_2$ gas and an HF gas are used, and an $NH_3$ gas and an $F_2$ gas are used, as an etching gas in the etching process of Step 8. As shown in Table 1, if the $F_2$ gas, the HF gas, and the $NH_3$ gas are not simultaneously supplied, a mixed gas of the $F_2$ gas and the HF gas or a mixed gas of the $F_2$ gas and the $NH_3$ gas besides the $F_2$ gas may be used.

TABLE 1

|  | Si | SiN | $SiO_2$ |
| --- | --- | --- | --- |
| $F_2$ | 1 | 0.1 | 0 |
| $HF/F_2$ | 1 | 0.1~10 | 0 |
| $NH_3/F_2$ | 1 | 0.01~1 | 0~10 |

If the interlayer insulating film 105 exists, it is preferable that the $F_2$ gas is mixed with the $NH_3$ gas. Since the $NH_3$ gas is adsorbed onto the interlayer insulating film 102, a protective layer is formed on the interlayer insulating film 102, and silicon may be etched while protecting the interlayer insulating film 102 from etching. Also, if silicon nitride (SiN) does not need to be etched, it is preferable that only the $F_2$ gas is used. If SiN needs to be etched, it is preferable that the $F_2$ gas is mixed with the HF gas. The HF gas accelerates reaction of a SiN film.

Although the present invention has been described with reference to the methods of the embodiment of FIGS. 4(a) through 4(g) and the another embodiment of FIG. 11, the present invention is not limited thereto and various modifications may be made.

For example, although in the method of FIGS. 4(a) through 4(g), cleaning is performed when a temperature of the wafer W is 40° C., the temperature of the wafer W is not limited to 40° C., and may range from 10 to 60° C. Although a pressure in a chamber is 40 mTorr while an HF gas, an $NH_3$ gas, and an $F_2$ gas are supplied, the pressure in the chamber is not limited to 40 mTorr, and may range from 10 to 40 mTorr. A flow rate of the $F_2$ gas is not limited to 113 sccm, and may range from 5 to 25% of a total flow rate of the HF gas, the $NH_3$ gas, and the $F_2$ gas. If the flow rate of the $F_2$ gas exceeds 25% of the total flow rate of the HF gas, the $NH_3$ gas, and the $F_2$ gas, etching of $SiO_2$ is accelerated by the $F_2$ gas, thereby, for example, increasing the amount of etching of the interlayer insulating film 102. If the flow rate of the $F_2$ gas is less than 5%, the amount of etching of silicon is reduced to a level that is substantially equal to that when the $F_2$ gas is not added. It is preferable that a gaseous ratio of the HF gas to the $NH_3$ gas is 1:1. In addition, a pressure may be controlled by adjusting flow rates of inert gases such as a $N_2$ gas and an Ar gas.

In the method of the another embodiment of FIG. 11, a purge process of Step 6 is not essentially required. If the supply of the $NH_3$ gas or the HF gas is stopped, in Step 8, since the $F_2$ gas, the HF gas, and the $NH_3$ gas are not simultaneously supplied, it is possible to etch silicon.

In the methods of the embodiment of FIGS. 4(a) through 4(g) and the another embodiment of FIG. 11, although the native oxide film 104 is removed from the bottom of the contact hole 102a, other modifications may be made, and the native oxide film may be removed from a via hole through which lines contact each other, or an open hole in which an electrode or a line is buried. The native oxide film 104 may be etched by using a halogen-containing gas instead of the HF gas, and by using a basic gas instead of the $NH_3$ gas, and silicon may be etched by using a xenon difluoride ($XeF_2$) gas or a chlorine trifluoride ($ClF_3$) gas instead of the $F_2$ gas.

Figure 14:
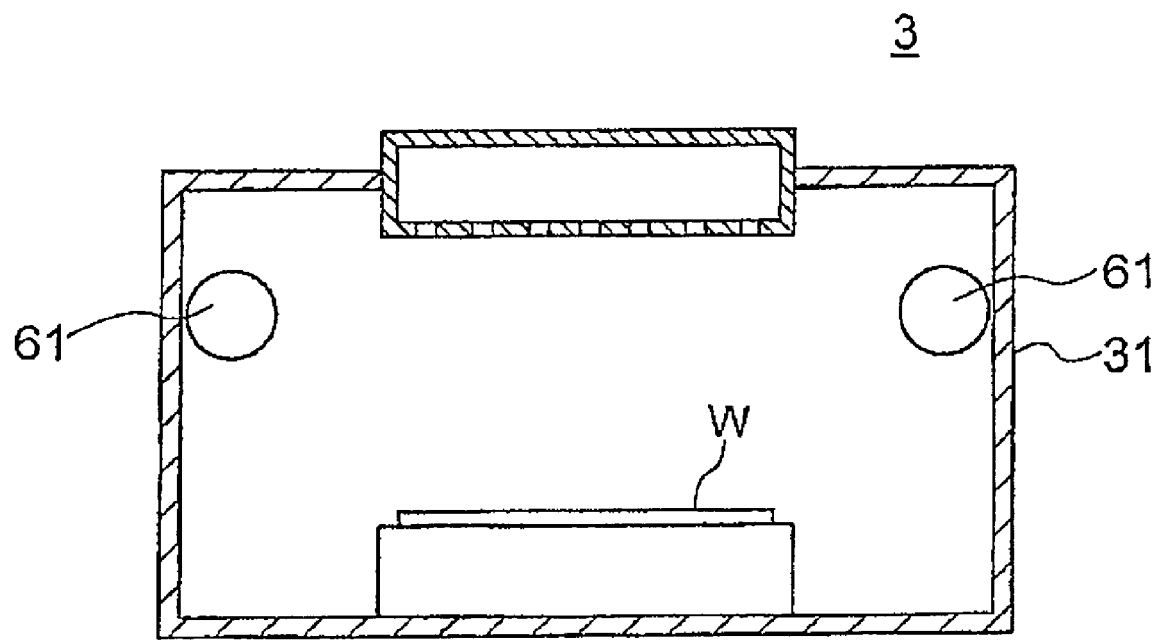
FIG. 14 illustrates modification of an embodiment of the present invention.

Although the dry etching device 3 and the heat treatment device 4 have respectively $N_2$ gas supply sources, a $N_2$ gas supply source may be shared by the dry etching device 3 and the heat treatment device 4. The dry etching device 3 and the heat treatment device 4 may be combined as one device to heat the substrate and remove the condensation layer 105. In this case, if a heater is located in the loading table 32 in the dry etching device 3, the substrate on which the condensation layer 105 is formed may be heated. Alternatively, as shown in FIG. 14, a lamp heater 61 may be separately constituted in the chamber 31 of the dry etching device 3 to directly heat the substrate (wafer W) due to radiant heat.

As described above, according to the method and system for etching the substrate according to the present invention, since a silicon layer into which carbon is implanted is removed like in wet etching, contact resistance can be reduced. Although a condensation layer is generated when a silicon oxide film on a surface of a silicon substrate is reacted with an HF gas and an $NH_3$ gas to alter the silicon oxide film, since a silicon etching gas including at least one selected from the group consisting of an $F_2$ gas, a $XeF_2$ gas, and a $ClF_3$ gas passes through the condensation layer, silicon under the condensation layer can be etched. Furthermore, since the method is dry etching using a gas, a watermark of wet etching which is a bunch of particles left after water is evaporated can be prevented.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of etching a substrate having a silicon surface on which a silicon oxide film is formed, the method comprising:
- etching the silicon oxide film by supplying a halogen-containing gas and a basic gas to the substrate so that the silicon oxide film is chemically reacted with the halogen-containing gas and the basic gas to generate a condensation layer;
- etching silicon under the condensation layer by supplying a silicon etching gas, wherein the silicon etching gas comprises at least one selected from the group consisting of a fluorine ($F_2$) gas, a xenon difluoride ($XeF_2$) gas, and a chlorine trifluoride ($ClF_3$) gas, to the substrate; and
- after the etching of the silicon oxide film and the etching of the silicon, heating and removing the condensation layer from the substrate.

2. The method of claim 1, wherein the halogen-containing gas is a hydrofluoric (HF) gas, the basic gas is an ammonia ($NH_3$) gas, and the silicon etching gas is an $F_2$ gas.

3. The method of claim 1, wherein the halogen-containing gas, the basic gas, and the silicon etching gas are simultaneously supplied to the substrate,
wherein the etching of the silicon oxide film and the etching of the silicon are simultaneously performed.

4. The method of claim 1, wherein, after the etching of the silicon oxide film, the etching of the silicon is performed,
wherein the etching of the silicon comprises etching silicon under the condensation layer that is formed during the etching of the silicon oxide film by supplying a gas comprising the silicon etching gas to the substrate, without simultaneously supplying the halogen-containing gas, the basic gas, and the silicon etching gas to the substrate.

5. The method of claim 4, wherein, the method further comprises, between the etching of the silicon oxide film and the etching of the silicon, purging which discharges a residual gas from a processing container.

6. The method of claim 4, wherein the etching of the silicon comprises supplying only an $F_2$ gas as the silicon etching gas, an $F_2$ gas and an $NH_3$ gas as the silicon etching as, or an $F_2$ gas and an HF gas as the silicon etching gas to the substrate.

7. The method of claim 1, wherein the silicon oxide film is a native oxide film formed under a contact hole formed in an interlayer insulating film.

8. The method of claim 7, wherein the interlayer insulating film is a silicon oxide-based insulating film.

* * * * *